(12) United States Patent
Park

(10) Patent No.: US 6,803,669 B2
(45) Date of Patent: Oct. 12, 2004

(54) INTEGRATED CIRCUITS HAVING SELF-ALIGNED METAL CONTACT STRUCTURES

(75) Inventor: Byung-jun Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/716,780

(22) Filed: Nov. 19, 2003

(65) Prior Publication Data

US 2004/0099965 A1 May 27, 2004

Related U.S. Application Data

(62) Division of application No. 10/172,760, filed on Jun. 14, 2002, now Pat. No. 6,710,466.

(30) Foreign Application Priority Data

Jun. 16, 2001 (KR) .................................. 2001-34139

(51) Int. Cl.[7] ............................................ H01L 27/108
(52) U.S. Cl. ...................... 257/906; 257/906; 257/908
(58) Field of Search .................. 257/906, 908, 257/332, 334, 346, 387; 438/279, 253, 239

(56) References Cited

U.S. PATENT DOCUMENTS

| | | | |
|---|---|---|---|
| 5,994,730 A | 11/1999 | Shrivastava et al. | ........ 257/306 |
| 6,051,476 A | 4/2000 | Lee | ............. 438/398 |
| 6,136,643 A | 10/2000 | Jeng et al. | ............ 438/253 |
| 6,136,716 A | 10/2000 | Tu | ...................... 438/694 |
| 6,187,672 B1 | 2/2001 | Zhao et al. | ................. 438/639 |
| 6,309,957 B1 | 10/2001 | Tu et al. | ..................... 438/622 |
| 6,365,453 B1 * | 4/2002 | Deboer et al. | ............. 438/253 |
| 6,369,446 B1 | 4/2002 | Tanaka | ...................... 257/758 |
| 6,372,571 B2 * | 4/2002 | Kim | ............................ 438/239 |
| 6,373,089 B1 | 4/2002 | Shrivastava et al. | ........ 257/306 |
| 6,406,968 B1 | 6/2002 | Chien et al. | ................ 438/381 |
| 6,448,140 B1 * | 9/2002 | Liaw | ........................ 438/279 |
| 6,486,033 B1 | 11/2002 | Tu et al. | ..................... 438/275 |

* cited by examiner

*Primary Examiner*—David Nelms
*Assistant Examiner*—Thinh T Nguyen
(74) *Attorney, Agent, or Firm*—Myers Bigel Sibley & Sajovec

(57) ABSTRACT

A microelectronic contact structure, e.g., a contact structure for a capacitor electrode of a DRAM, comprises a first dielectric layer on a substrate, a conductive region disposed on a first dielectric layer, a second dielectric layer on the first dielectric layer and contacting the conductive region at a sidewall of the conductive region, and an etch-stopping dielectric region disposed on the conductive region and having a sidewall in contact with the second dielectric layer. The etch-stopping dielectric region extends laterally beyond the sidewall of the conductive region and has an etching selectivity with respect to the second dielectric layer. A third dielectric layer is disposed on the second dielectric layer and etch-stopping dielectric region. A conductive plug extends through the third dielectric layer and along the sidewall of the etch-stopping dielectric region. For example, the conductive plug may contact a conductive pad formed on a source/drain region of an underlying substrate, and a capacitor may be disposed on the conductive plug, thus providing a capacitor memory cell.

13 Claims, 18 Drawing Sheets

INTEGRATED CIRCUITS HAVING SELF-ALIGNED METAL CONTACT STRUCTURES

RELATED APPLICATIONS

The present application is a divisional U.S. application Ser. No. 10/172,760, filed Jun. 14, 2002, now U.S. Pat. No. 6,710,466 entitled Method of Fabricating Integrated Circuit Having Self-Aligned Metal Contact Structure, the disclosure of which is hereby incorporated herein by reference.

RELATED APPLICATION

This application claims the benefit of Korean Patent Application No. 2001-34139, filed on Jun. 16, 2001, the contents of which are herein incorporated by reference in their entirety.

BACKGROUND OF THE INVENTION

The present invention relates to integrated circuit devices and fabrication methods, and more particularly, to self-aligned contact structures and methods of fabricating the same.

As integrated circuit memory devices, such as dynamic random access memories (DRM) have become more highly integrated and their storage capacity has expanded, the size of features on chips have generally decreased. For example, processes performed according to a design rule less than 0.13 $\mu$m have recently been developed for DRAM cell manufacture. Processes for reducing the size of peripheral circuit features have also been developed.

However, a reduction in the design rule and chip size of DRAM cells can result in a failure to establish a sufficient process margin and desirable operational characteristics for devices. To solve these problems, processes for forming a capacitor-over-bit (COB) line structure, a self-aligned contact plug, a P+/N+ bit-line coincident-contact plug and a bit-line stud pad, have been developed.

In particular, for a DRAM cell with a COB structure, a one-cylinder storage node (OCS) structure has been used with a dielectric layer having a high dielectric constant to obtain sufficient cell capacitance. Also, active areas of a capacitor electrode have been increased by increasing the height of a storage node. However, increased storage node height can produce an undesirably large step difference between a cell domain and peripheral circuit domain. This can reduce a photolithography process margin for formation of a metal interconnection. Therefore, a process including forming an interlayer dielectric layer after the upper electrode of a capacitor is formed and planarizing the interlayer dielectric layer through a chemical mechanical polishing (CMP) process, has been suggested.

However, due to the height of the storage node and use of the CMP process, the thickness of the interlayer dielectric layer to be etched can exceed 3 $\mu$m when a contact hole for a metal contact plug is formed. If the thickness of the interlayer dielectric layer is increased, the contact hole may not be completely open due to a loading effect arising from differences in etching selectivity between a wide contact hole and a narrow contact hole, and between domains having a thick contact hole and a thin contact hole. In particular, the contact hole may become narrower towards the bottom, and therefore, a contact area between the metal contact plug and a bit line may become smaller, thereby potentially increasing contact resistance. An increase in contact resistance may increase signal degradation and increase power consumption. Further, as the design rule decreases, a short due to reduced alignment margin between the metal contact plug and a gate electrode can occur. Chip size of a DRAM cell can also be reduced by forming a P+/N+ contact plug of a bit-line contact plug instead of the existing contact plug when a sense amplifier is formed.

As described above, to solve the problems caused by a phenomenon in which the thickness of the interlayer dielectric layer increases when the contact hole is formed and apply the P+/N+ bit line coincident-contact plug, the metal contact plug can be made on the bit line stud pad by forming the bit line stud pad in contact with the bit line contact plug. In this case, as design rules decrease, the width of the bit line stud pad may need to be increased to secure an adequate alignment margin between the metal contact plug and the bit line stud pad. However, an increase in the width of the bit line stud pad can reduce a margin in the depth of focus for the photolithography used on patterning the bit line stud pad. As a result, problems, such as bridging, can occur.

SUMMARY OF THE INVENTION

According to some embodiments of the present invention, an integrated circuit comprises conductive patterns formed on a semiconductor substrate. Dielectric patterns are disposed between the conductive patterns on the substrate, each having a cross-section with an upside-down T shape and having greater thickness than the conductive patterns. A nitride film liner lines trenches defined by the conductive patterns and the dielectric patterns. A dielectric layer is disposed on the nitride film liner, filling the trenches. At least one metal contact plug passes through the dielectric layer and the nitride film liner and is in contact with at least one of the conductive patterns.

According to further embodiments of the present invention, an integrated circuit comprises conductive patterns on a semiconductor substrate in first and second domains. Dielectric patterns are disposed between the conductive patterns on the semiconductor substrate, each having a cross-section which is an upside-down T shape and having a greater thickness than the conductive patterns. A nitride film liner lines trenches defined by the conductive patterns and the dielectric patterns. A dielectric layer fills the trenched in the second domain. Nitride film studs having insubstantial step difference with respect to the dielectric patterns are disposed on the first domain and cover upper surfaces of the conductive patterns. At least one capacitor is in contact with a conductive region of the semiconductor substrate and passes through the dielectric patterns. An intermetal dielectric layer is disposed on the capacitor and the dielectric layer. At least one metal contact plug is in contact with at least one of the conductive patterns and passes through the intermetal dielectric layer, the dielectric layer and the nitride film liner.

In some method embodiments of the present invention, conductive patterns are formed on a semiconductor substrate. Dielectric patterns are formed between the conductive patterns on the semiconductor substrate, each having a cross-section with an upside-down T shape and a thickness greater than the conductive patterns. Trenches defined by the conductive patterns and the dielectric patterns are lined with a nitride film. A dielectric layer is formed on the nitride film to thereby fill the trenches. At least one metal contact plug is formed that passes through the dielectric layer and the nitride film liner and is in contact with at least one of the conductive patterns.

In further embodiments of the present invention, conductive patterns are formed on a semiconductor substrate in first and second domains. Dielectric patterns are formed between the conductive patterns on the semiconductor substrate, each having a cross-section with an upside-down T shape and a thickness greater than the conductive patterns. Trenches defined by the conductive patterns and the dielectric patterns are lined with a nitride film. A dielectric layer is formed, filling the lined trenches. Nitride film studs having insubstantial step difference with respect to the dielectric patterns are formed, the nitride film studs covering upper surfaces of the conductive patterns. At least one capacitor is formed that passes through the dielectric patterns to contact a conductive region of the semiconductor substrate. An intermetal dielectric layer is formed on the capacitor. At least one metal contact plug is formed that passes through the dielectric layer and the nitride film liner to contact at least one of the conductive patterns.

DETAILED DESCRIPTION

Figure 1:
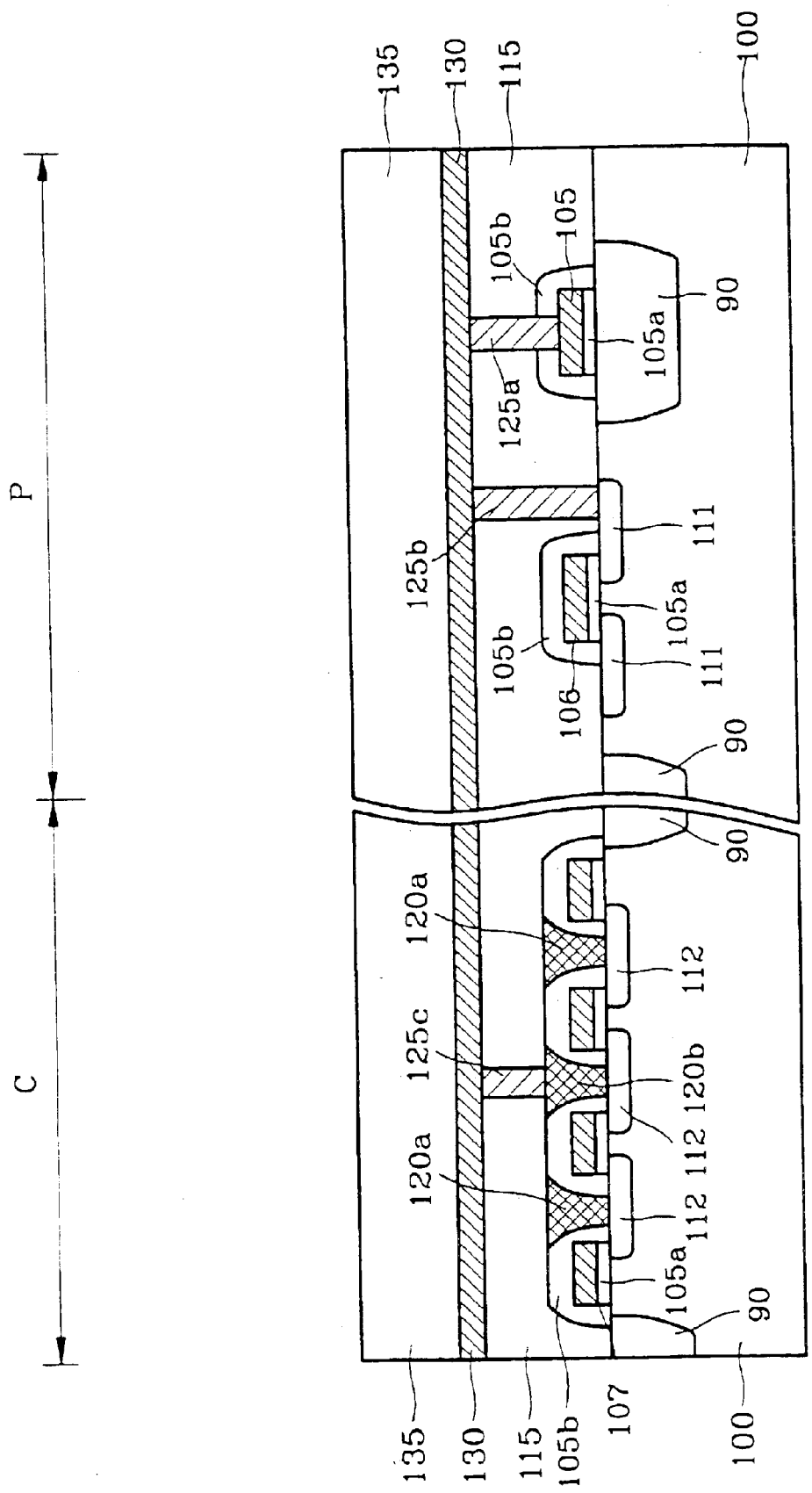
FIGS. 1–10 are cross-sectional views illustrating an integrated circuit and operations for fabricating the same according to some embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. Embodiments of the present invention can provide improvements to contact structures for integrated circuit devices, such as the integrated circuit memory devices described in U.S. patent application Ser. No. 09/889,588, the disclosure of which is incorporated herein by reference in its entirety. However, it will be appreciated that the invention is applicable to contact structures in integrated circuit devices other than memory devices.

Figure 17:
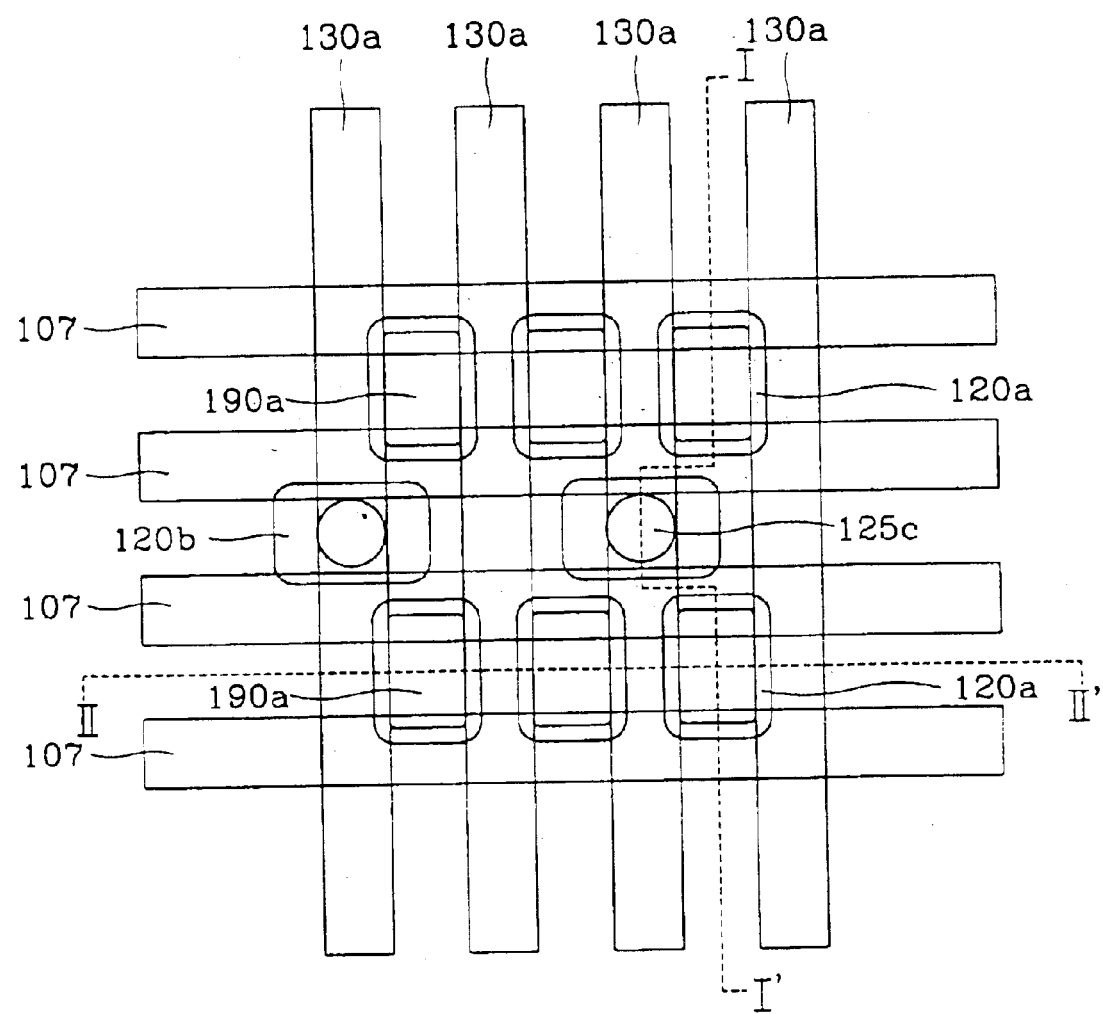
FIG. 17 is a plan view of a cell domain of the integrated circuit of FIGS. 1–10.

FIGS. 1–10 are cross-sectional views illustrating an integrated circuit device and operations for fabricating the same according to first embodiments of the present invention. FIG. 17 is a layout plane view illustrating a cell domain of the integrated circuit according to first embodiments of the present invention. The cross-section of a cell domain C shown in FIG. 1 and FIGS. 2–10 corresponds to a line I–I' and a line II–II', respectively, shown in FIG. 17.

Referring to FIG. 1, a shallow trench isolation (STI) film is formed as an isolation film 90 on a semiconductor substrate 100. The isolation film 90 defines the cell domain C and a peripheral circuit domain P and, further, separates elements formed on the domains C and P from each other. A first gate 105 and a first source/drain (not shown) and a second gate 106 and a second source/drain 111 are formed in the peripheral circuit domain P. A plurality of third gates 107 and a third source/drain 112 are formed in the cell domain C. A gate insulating layer 105a is interposed between the first, second and third gates 105, 106 and 107 and the semiconductor substrate 100. The upper surfaces and sidewalls of depositions made of the gate insulating layer 105a and any one of the first, second and third gates 105, 106, 107, are surrounded by a nitride-film spacer 105b.

A first dielectric layer (not illustrated as an independent layer) is formed on the semiconductor substrate 100 having the first, second and third gates 105, 106, 107 and the source/drain 11 and 112. Then the first dielectric layer is patterned to form a hole exposing the third source/drain 112. After a conductive material for filling the hole is deposited, the upper surface of the resultant structure is planarized to form first and second conductive pads 120a, 120b, which are separated from each other.

A second dielectric layer (not illustrated as an independent layer) is formed on the resultant structure. The second dielectric layer combines with the first dielectric layer to form a lower dielectric layer 115. A first contact plug 125a in contact with the first gate 105 and a second contact plug 125b in contact with the second source/drain 111 are then formed, each passing through the lower dielectric layer 115. A third contact plug 125c in contact with the upper surface of the second conductive pad 120b is also formed. The second and third contact plugs 125b, 125c function as bit line contact plugs. A conductive layer 130 is formed on the lower dielectric layer 115 having the first, second and third contact plugs 125a, 125b, 125c and a nitride film 135 is formed on the conductive layer 130.

Figure 2:
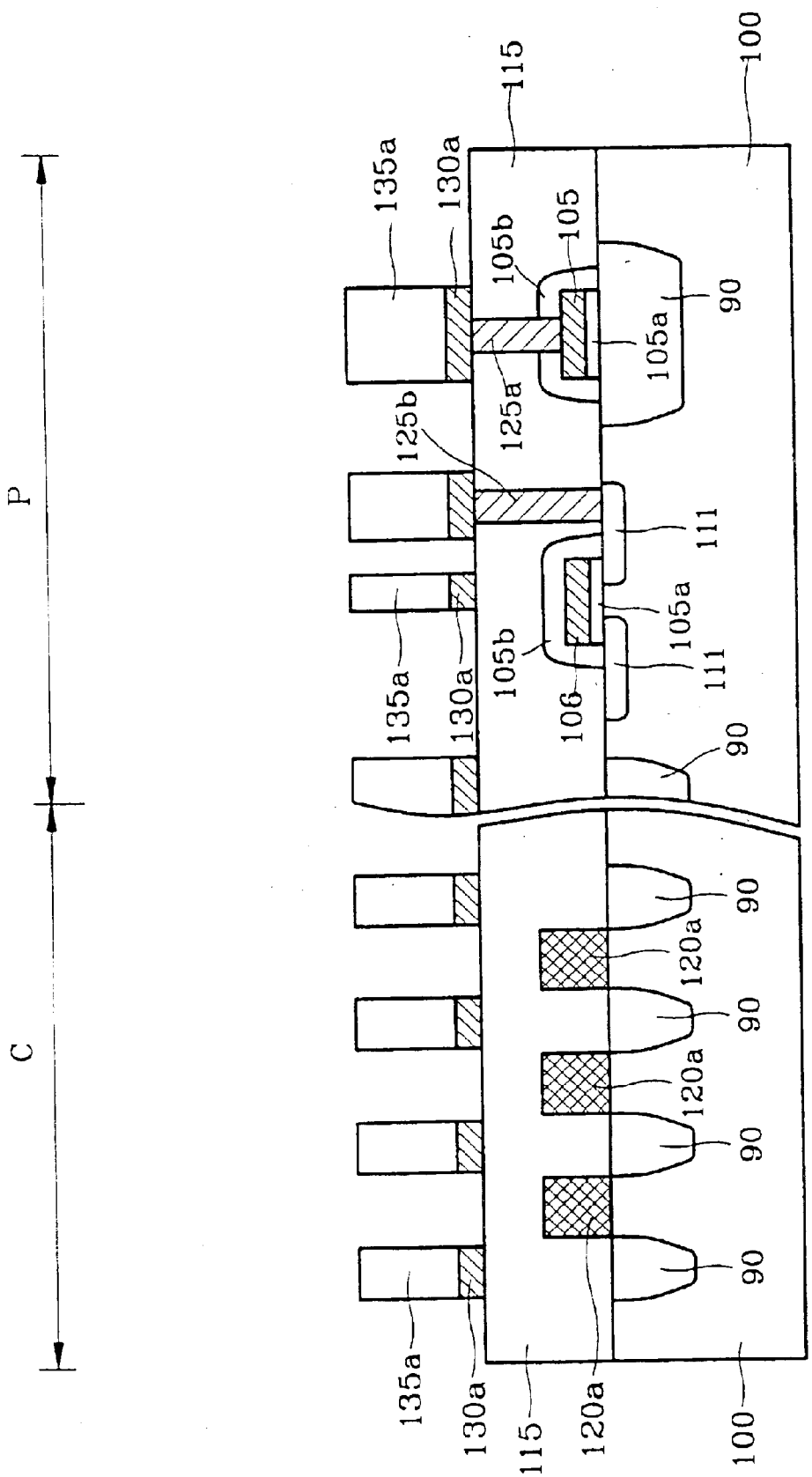

Referring to FIG. 2, the conductive layer 130 and the nitride film 135 are patterned to form conductive patterns 130a and nitride patterns 135a which contact the upper surfaces of the first, second and third contact plugs 125a, 125b, 125c.

Figure 3:
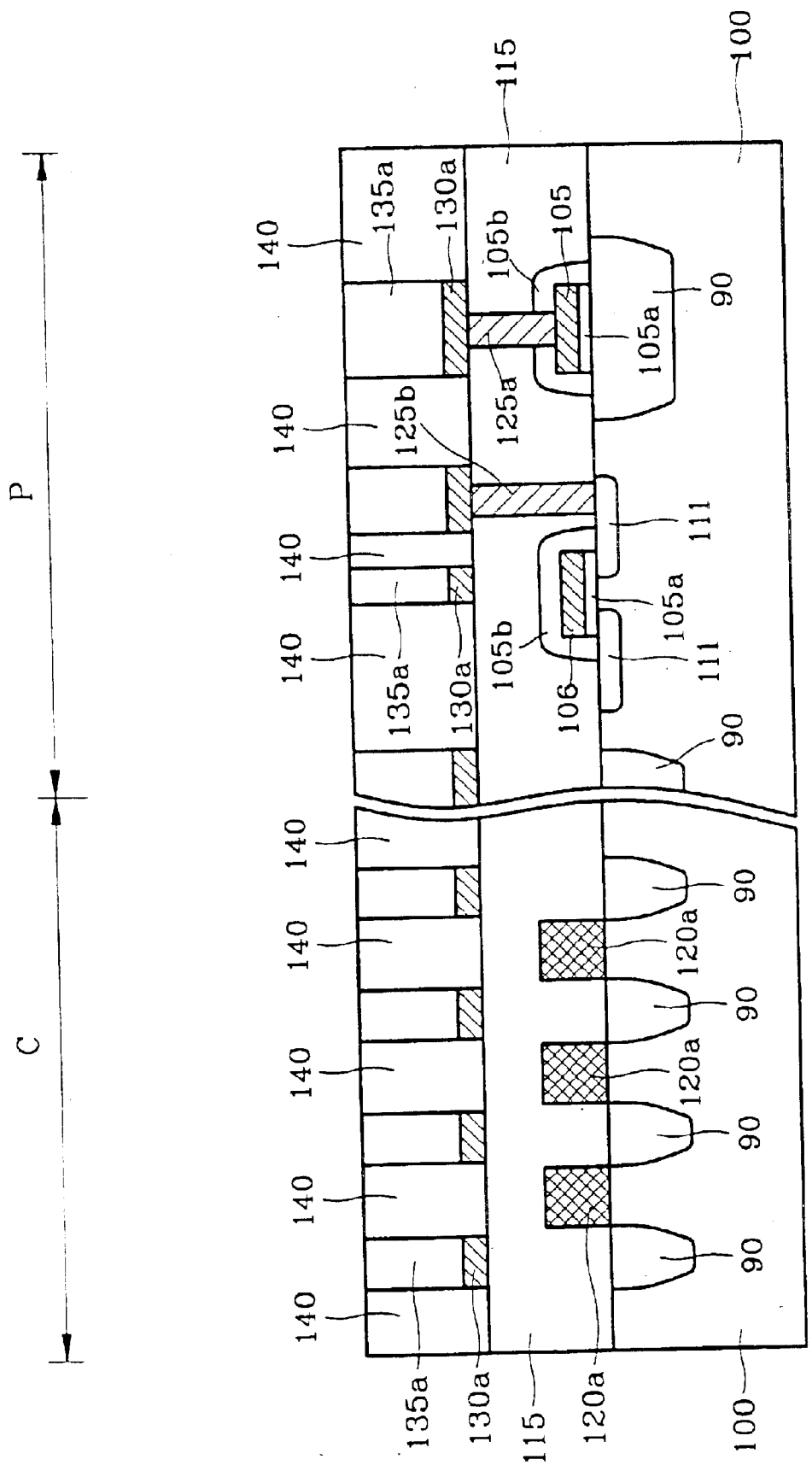

Referring to FIG. 3, a dielectric layer 140 is formed to have little or no step difference with respect to the structure composed of the conductive patterns 130a and the nitride patterns 135a. The dielectric layer 140 is obtained by depositing a dielectric material to fill gaps between the patterns 130a, 135a, and then performing a chemical mechanical polishing (CMP) such that the upper surfaces of the nitride patterns 135a are exposed.

Figure 4:
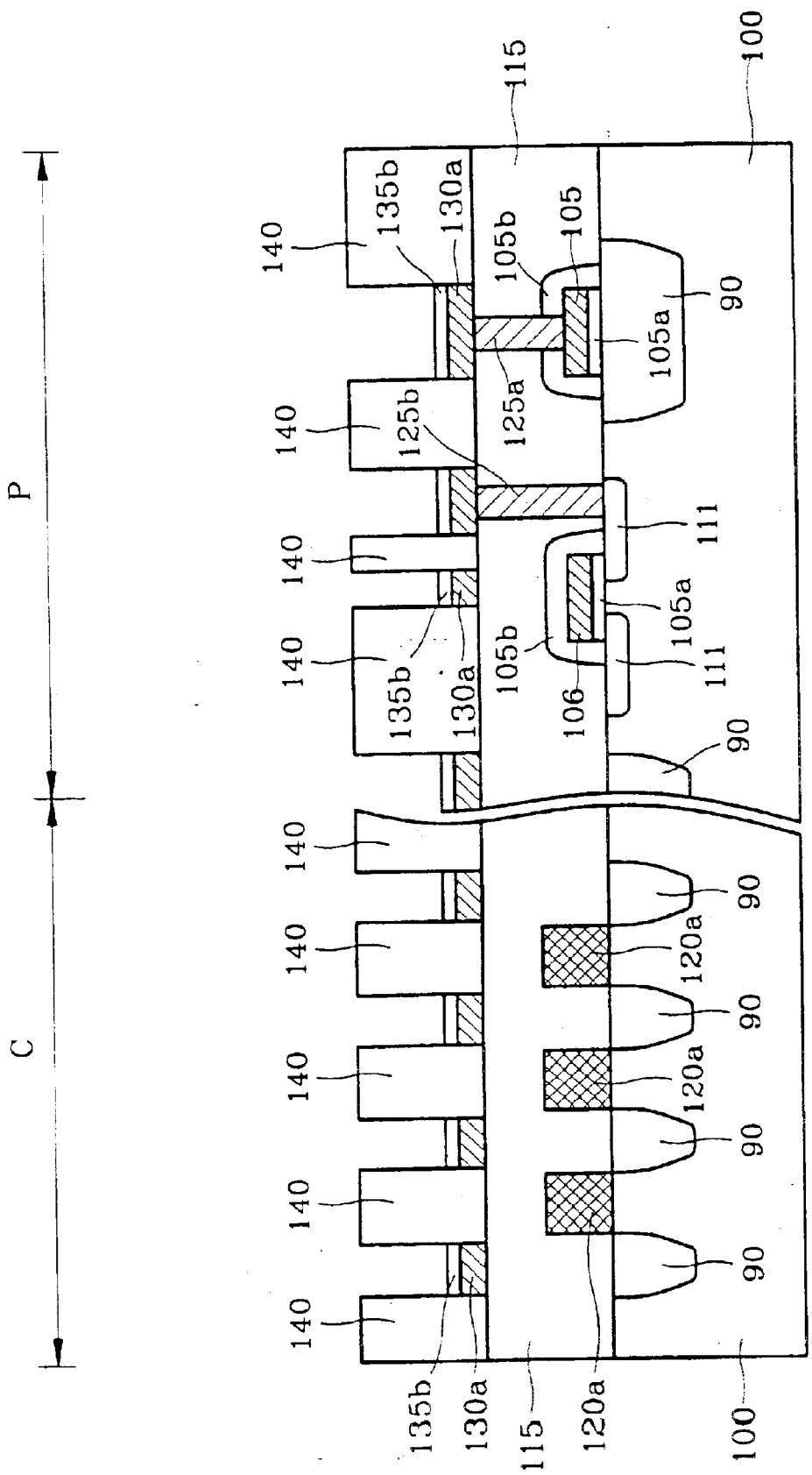

Referring to FIG. 4, a predetermined thickness of the nitride patterns 135a is etched away to form remnant nitride patterns 135b. It is preferable that the dielectric layer 140 undergoes little or no etching. The remnant nitride patterns 135b are preferably formed through an etching process in which the nitride film pattern 135a has a superior etching selectivity to the dielectric layer 140. In a subsequent process, the remnant nitride patterns 135b are etched when a portion of the dielectric layer 140 is etched, thereby preventing the conductive patterns 130a from being etched. For this reason, the thickness of the remnant nitride patterns 135b preferably depends on the dielectric layer 140 to be etched.

Figure 5:
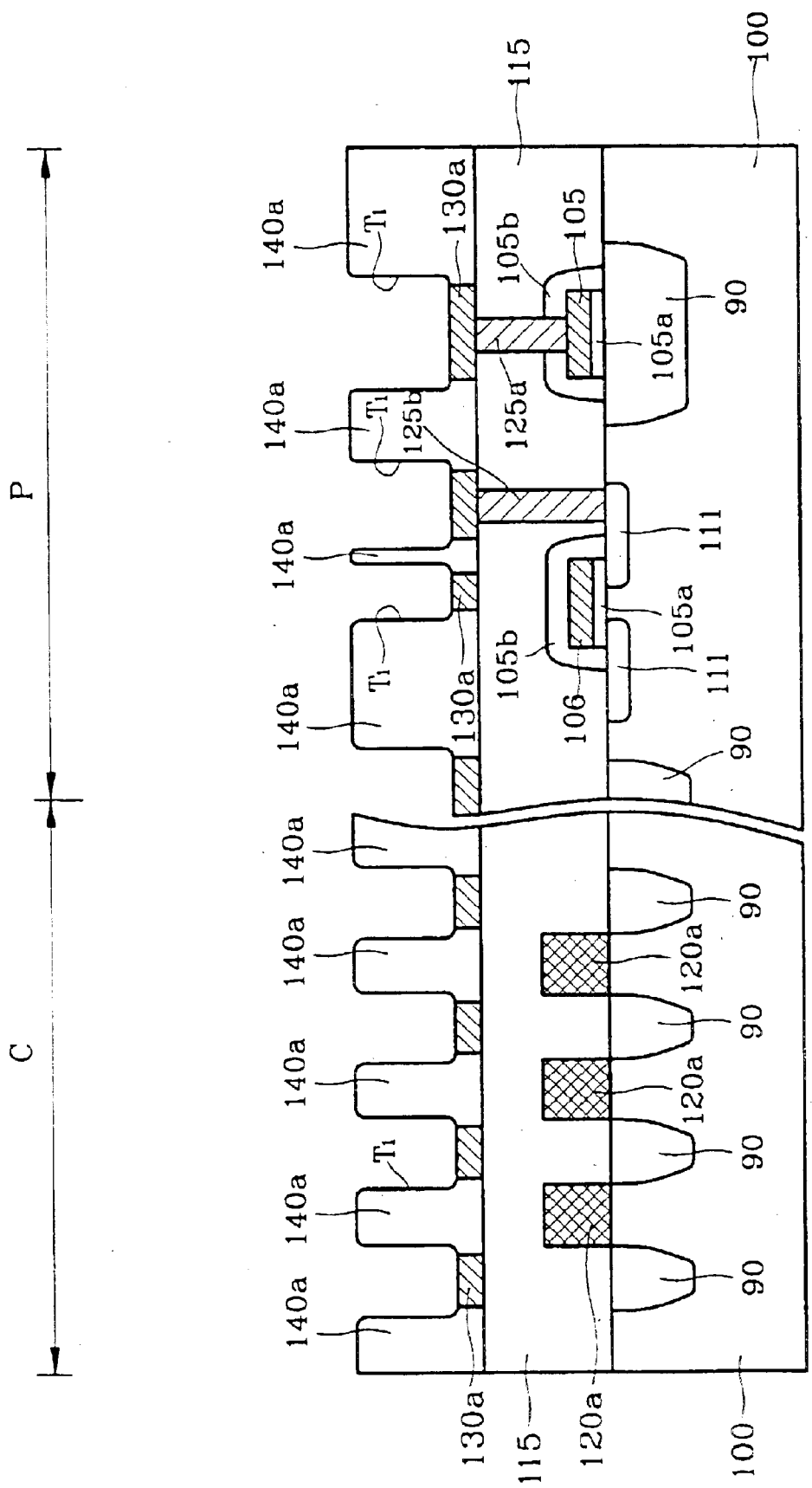

FIG. 5 shows that a portion of the dielectric layer 140 and the remnant nitride patterns 135b are wet-etched. As a result of the wet etching, inverted T-shaped dielectric patterns 140a are formed between the conductive patterns 130a. The dielectric patterns 140a and the conductive patterns 130a define trenches T1 having widths greater than the conductive patterns 130a. It is preferable that a portion of the dielectric layer 140 and the remnant nitride patterns 135b are etched through an etching process where the remnant nitride patterns 135b have little or no etching selectivity with respect to the dielectric layer 140.

Figure 6:
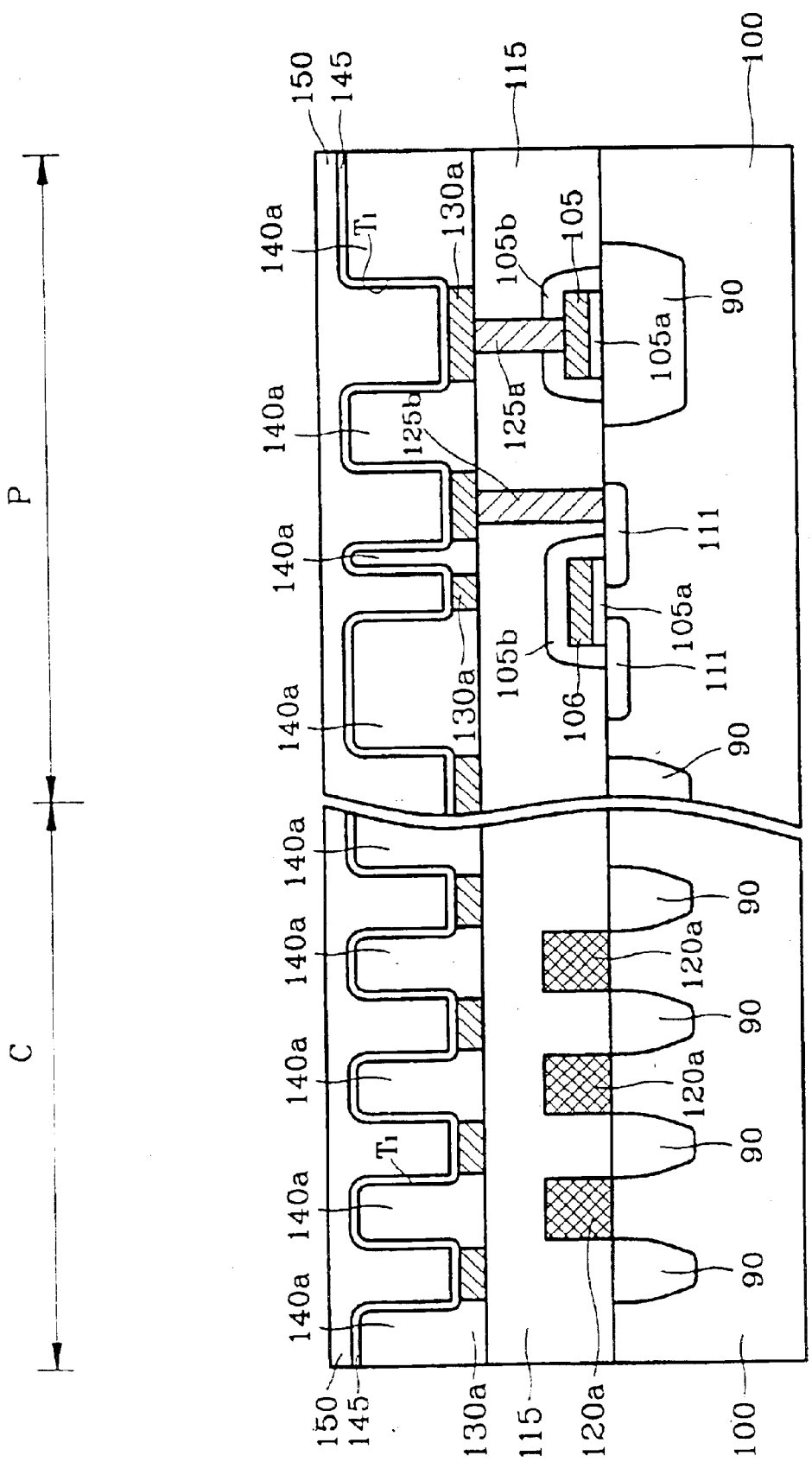

Referring to FIG. 6, a nitride film liner 145 is formed on the conductive patterns 130a and the dielectric patterns 140a. The nitride film liner 145 is preferably formed so that the trench T1 is not completely filled. For instance, the thickness of the nitride film liner 145 can be formed from 100 Å to 1000 Å. Next, another dielectric layer 150 is deposited to fill the trench T1.

Figure 7:
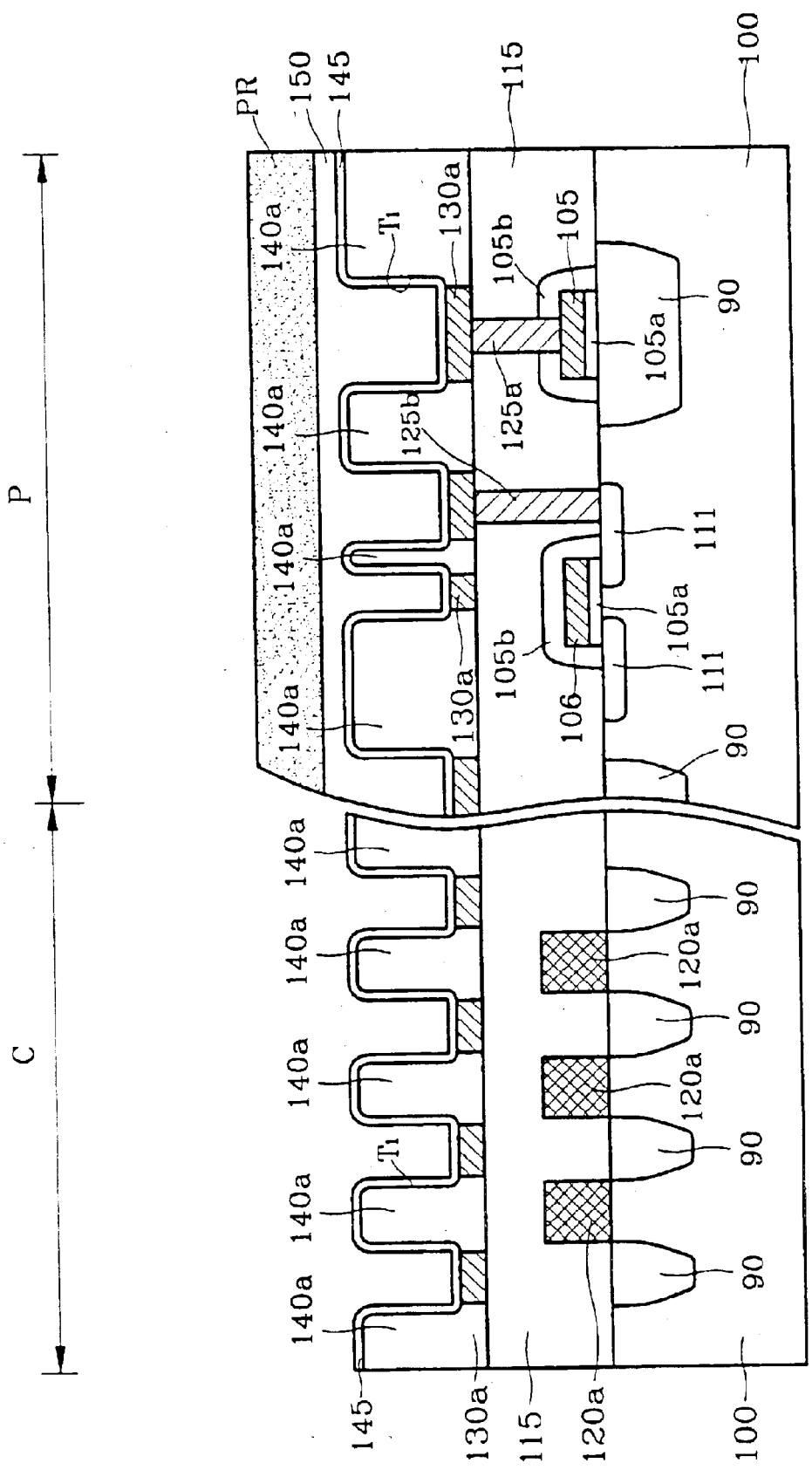

Referring to FIG. 7, a photosensitive mask PR exposing the cell domain C is formed. The dielectric layer 150 is etched using the photosensitive film pattern PR as a mask, so that the nitride film liner 145 on the cell domain C is exposed.

Figure 8:
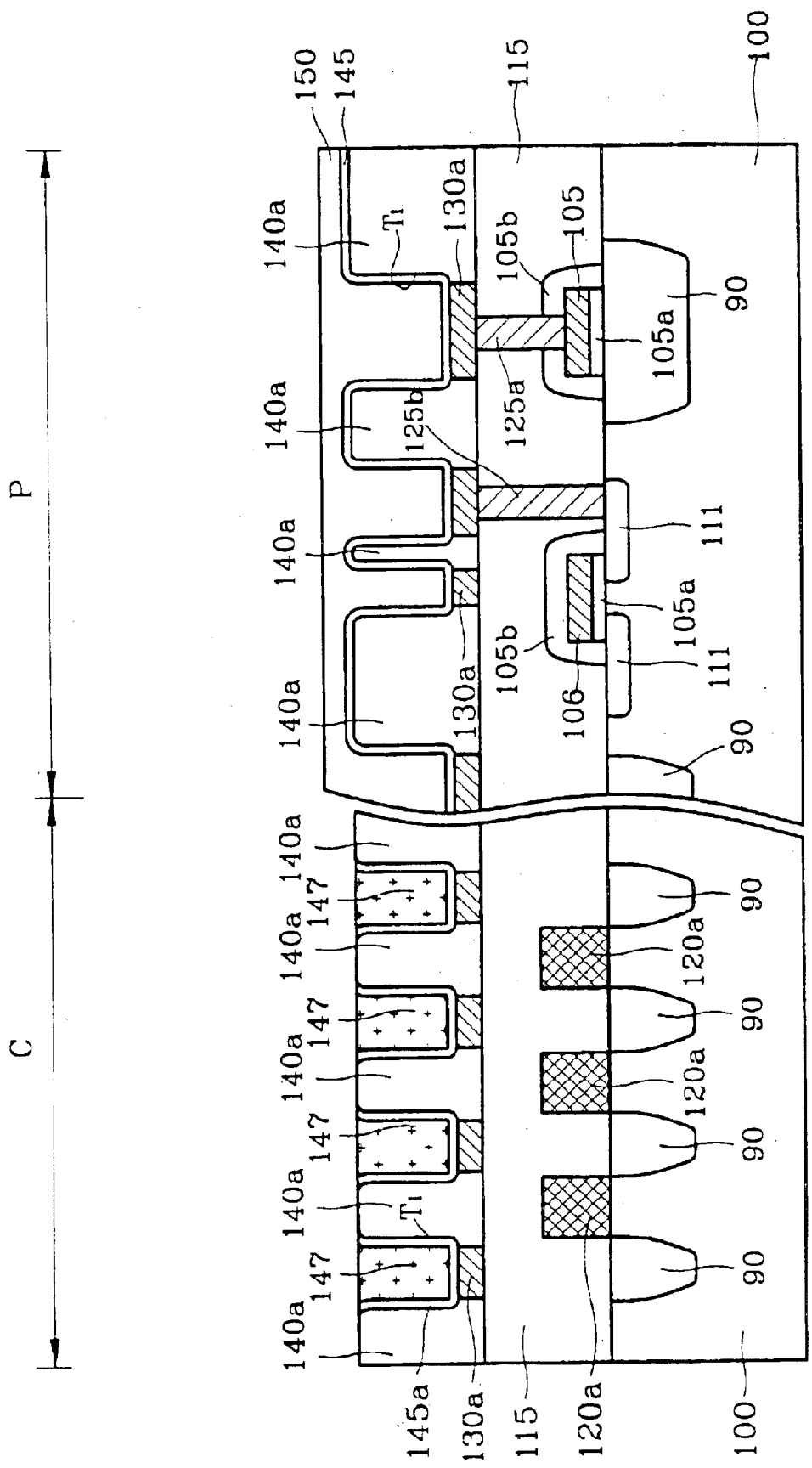

Referring to FIG. 8, the photosensitive film PR is removed and a nitride layer is then deposited on the resultant structure, so that the trench T1 is filled. The upper surface of the resultant structure is planarized to expose the dielectric patterns 140a, preferably through an etch-back process. As a result, nitride film studs 147 having little or no step difference with respect to the dielectric patterns 140a are formed on the upper surfaces of the conductive patterns 130a in the cell domain C. During the etch-back process, the nitride film liner 145 is patterned to form well-shaped nitride film liner patterns 145a.

Figure 9:
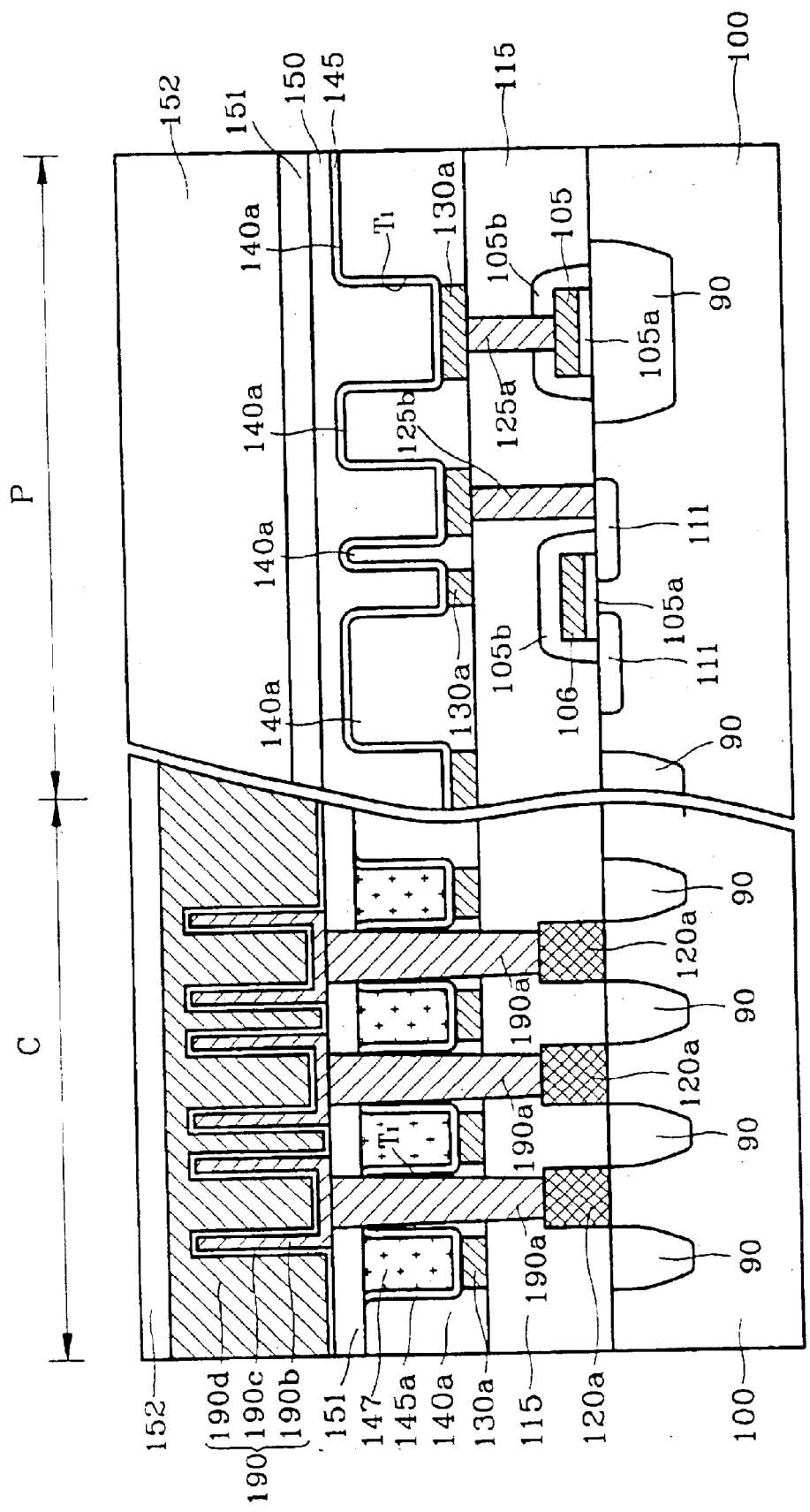

Referring to FIG. 9, a dielectric layer 151 is formed on the resultant structure. Then a capacitor 190, which is in contact with the upper surface of the first conductive pad 120a, is formed. First, a storage node contact hole is formed by etching the dielectric layer 151, the dielectric pattern 140a and the lower dielectric layer 115 using the nitride film studs 147 as a mask. The storage node contact hole is filled with a conductive material to form a storage node contact plug 190a. Then, a lower electrode 190b is formed, contacting the storage node contact plug 190a. An upper electrode 190d is obtained by forming a dielectric film on the lower electrode 190b, depositing a conductive material thereon, and then planarizing the deposited conductive material. A planarized intermetal dielectric layer 152 may then be formed on the resultant structure.

Figure 10:
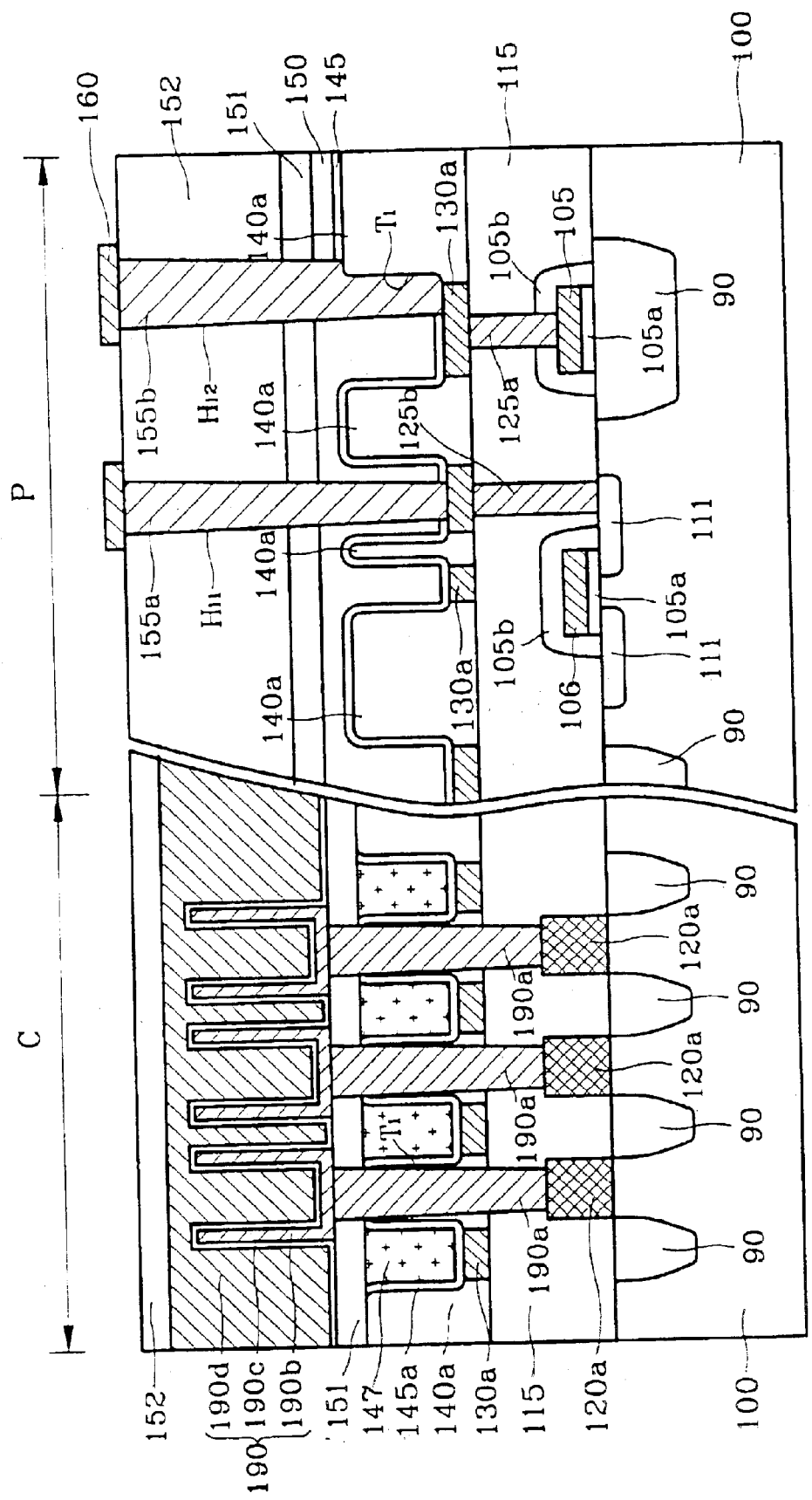

Referring to FIG. 10, the intermetal dielectric layer 152 and the dielectric layers 150, 151 are partially etched through an etching process in which they exhibit etching selectivity with respect to the nitride film liner 145, so that the nitride film liner 145 is exposed. Next, contact holes $H_{11}$ and $H_{12}$, which expose the conductive patterns 130a, are formed by etching the exposed portion of the nitride film liner 145.

The holes $H_{11}$ and $H_{12}$ are then filled with metal. As a result, metal contact plugs 155a and 155b in contact with the conductive patterns 130a are formed, passing through the intermetal dielectric layer 152, the dielectric layers 150 and 151 and the nitride film liner 145.

In some conventional processes, an interlayer dielectric layer and a bit line mask silicon-nitride film of about 2000 Å are etched to form contact holes for a metal contact plug; In contrast, according to some embodiments of the present invention, contact holes can be more easily formed by etching the interlayer dielectric layer and the nitride film liner, which is thinner than the bit line mask silicon-nitride film. Further, the nitride film liner 145 is formed along with trenches defined by the conductive patterns 130a and the dielectric patterns 140a, and therefore, has vertical and horizontal portions with respect to the semiconductor substrate 100. As shown in FIG. 10, the contact hole H12 can be self-aligned by the vertical portion of the nitride film liner 145. In a subsequent process, metal wiring 160 may be formed on the upper surfaces of the metal contact plugs 155a and 155b.

As shown in FIG. 10, it is possible to reduce contact resistance in the integrated circuit using the above-mentioned method, because there is a sufficient contact area between the conductive layer pattern, which is the bit line stud pad, and the metal contact plug. Further, the conductive layer pattern can be smaller. Therefore, for example, a desirable margin in the depth of focus of the photolithography for patterning the bit line stud pad can be obtained.

Figure 18:
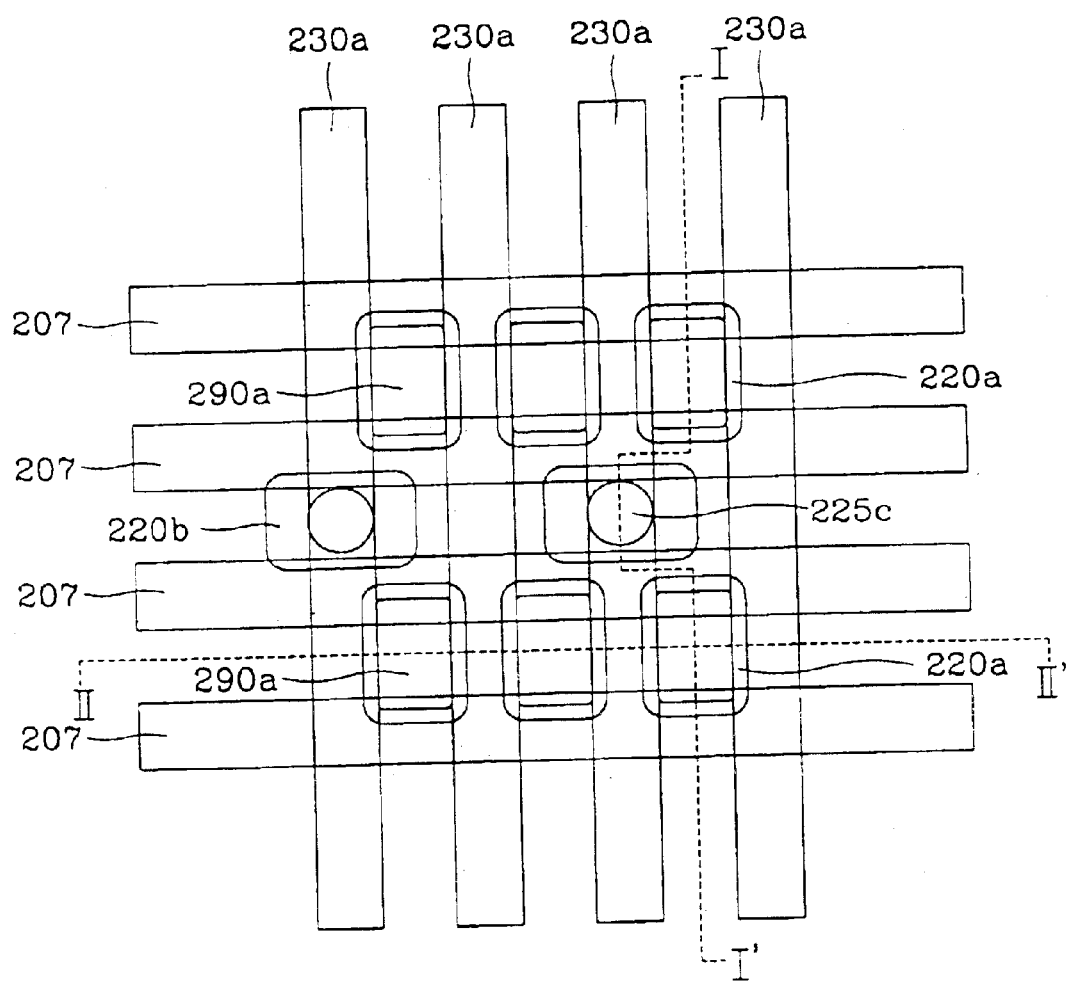
FIG. 18 is a plan view of a cell domain of the integrated circuit of FIGS. 11–16.

FIGS. 11–16 are cross-sectional views illustrating an integrated circuit and operations for fabricating the same according to second embodiments of the present invention. FIG. 18 is a layout plane view illustrating a cell domain of the integrated circuit according to second embodiments of the present invention. Here, the cell domains C shown in FIGS. 11 and 12–16 correspond to a portion I–I' and a portion II–II' shown in FIG. 18, respectively. The second embodiments are similar to the above-described first embodiments, but form dielectric patterns in a different manner.

Figure 11:
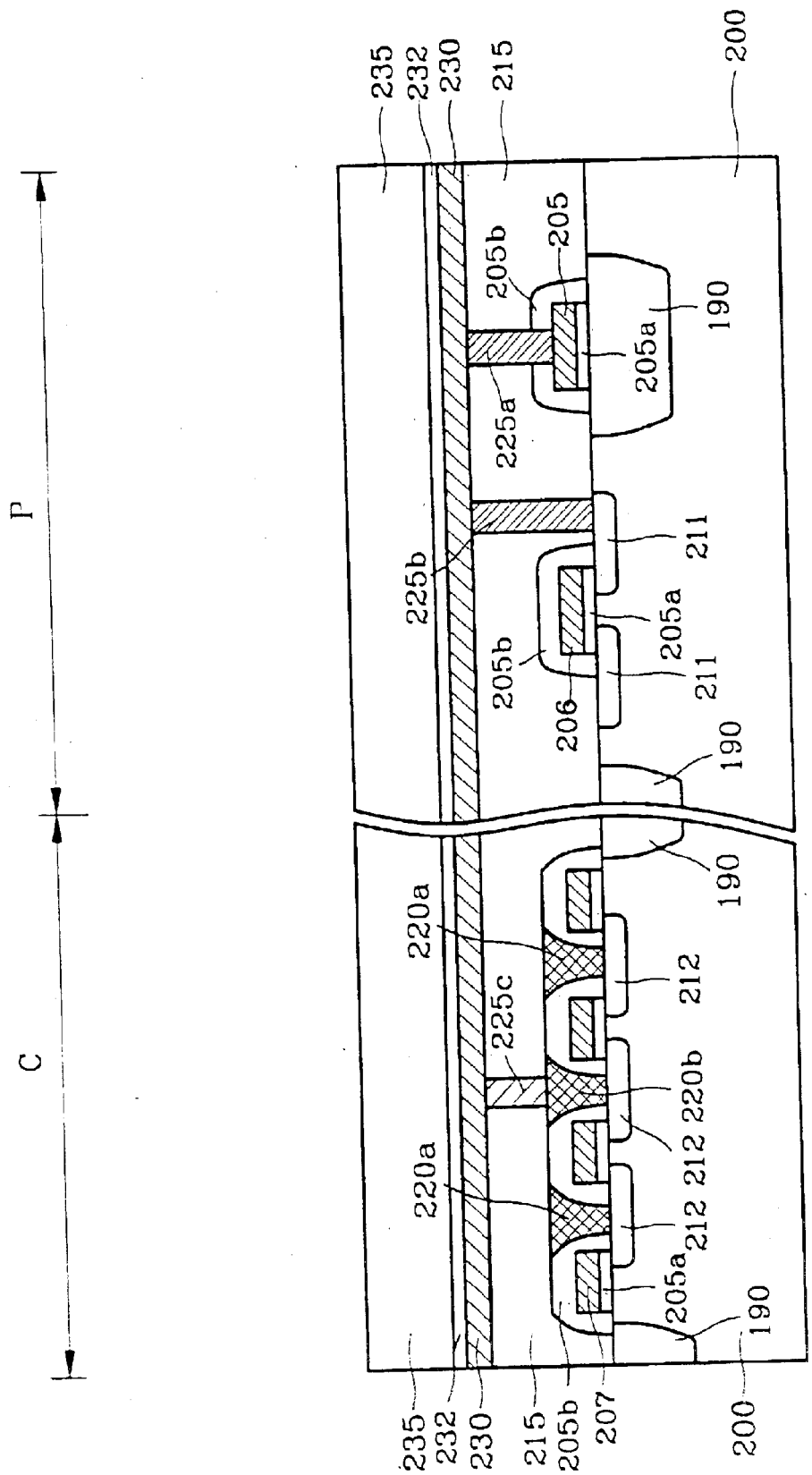
FIGS. 11–16 are cross-sectional views illustrating an integrated circuit and operations for fabricating the same according to further embodiments of the present invention.

Referring to FIG. 11, a first gate 205, a first source/drain (not shown), a second gate 206 and second sources/drains 211 are formed on a peripheral circuit domain P of a semiconductor substrate 200 as explained referring to FIG. 1. Also, a plurality of third gates 207 and third sources/drains 212 are formed in the cell domain C of the semiconductor substrate 200. The reference numerals 205a and 205b denote a gate insulating layer and a nitride film spacer, respectively.

First and second conductive pads 220a, 220b, which are in contact with the third sources/drains 212, are formed within a lower dielectric layer 215 formed on the first, second and third gates 205, 206, 207 and sources/drains 211, 212. First and second contact plugs 225a, 225b, which are bordered by the first gate 205 and the second sources/drains 211, respectively, and pass through the lower dielectric layer 215 are formed. Next, a third contact plug 225c in contact with the upper surface of the second conductive pad 220b is formed. Then, a conductive layer 230 is formed on the resultant structure, and an oxide film 232 and a nitride film 235 are sequentially formed on the conductive layer 230.

Figure 12:
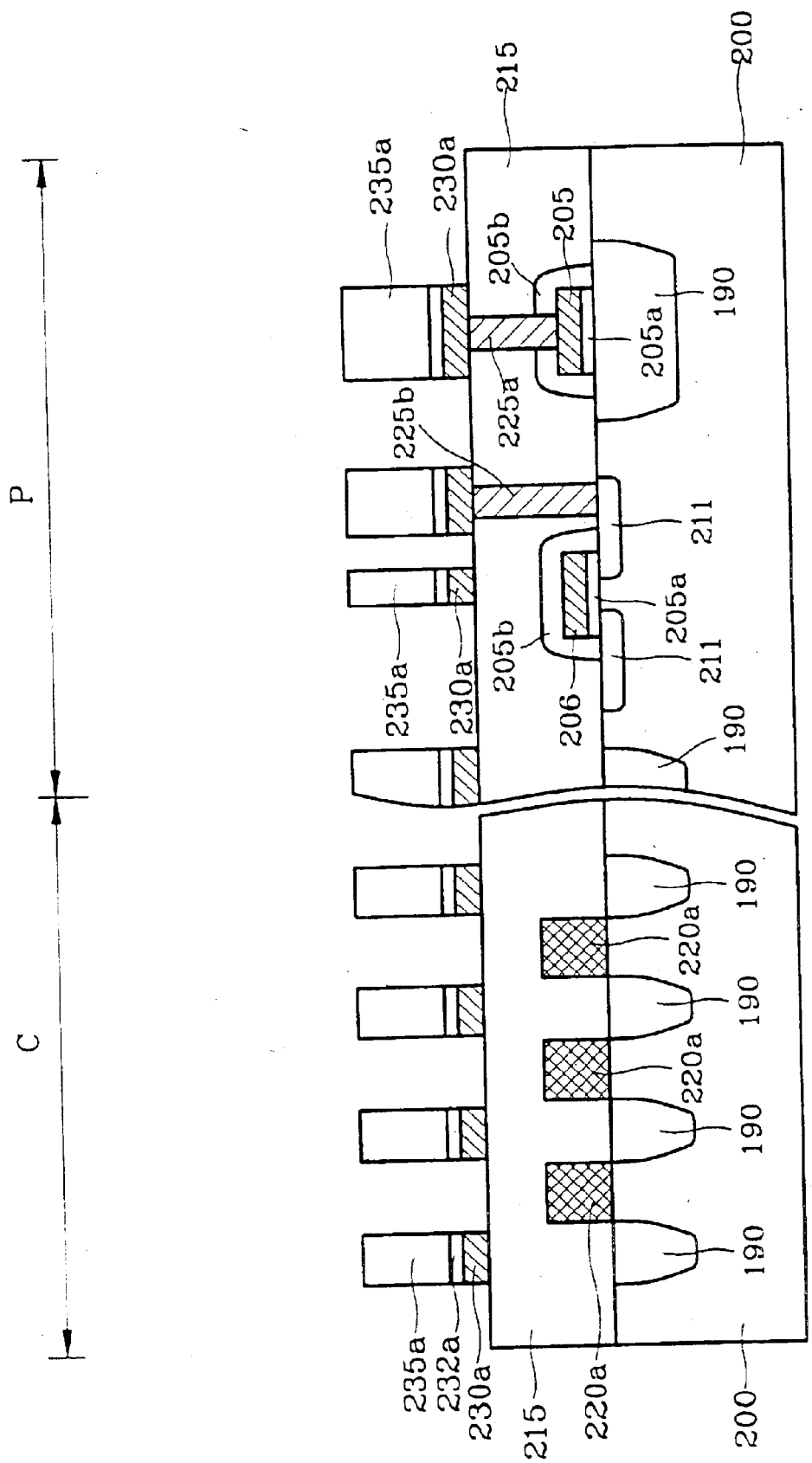

Referring to FIG. 12, the conductive layer 230, the oxide film 232 and the nitride film 235 are patterned to form conductive patterns 230a, oxide film patterns 232a and nitride patterns 235a, which are in contact with the upper surfaces of the first, second and third contact plugs 225a, 225b, 225c.

Figure 13:
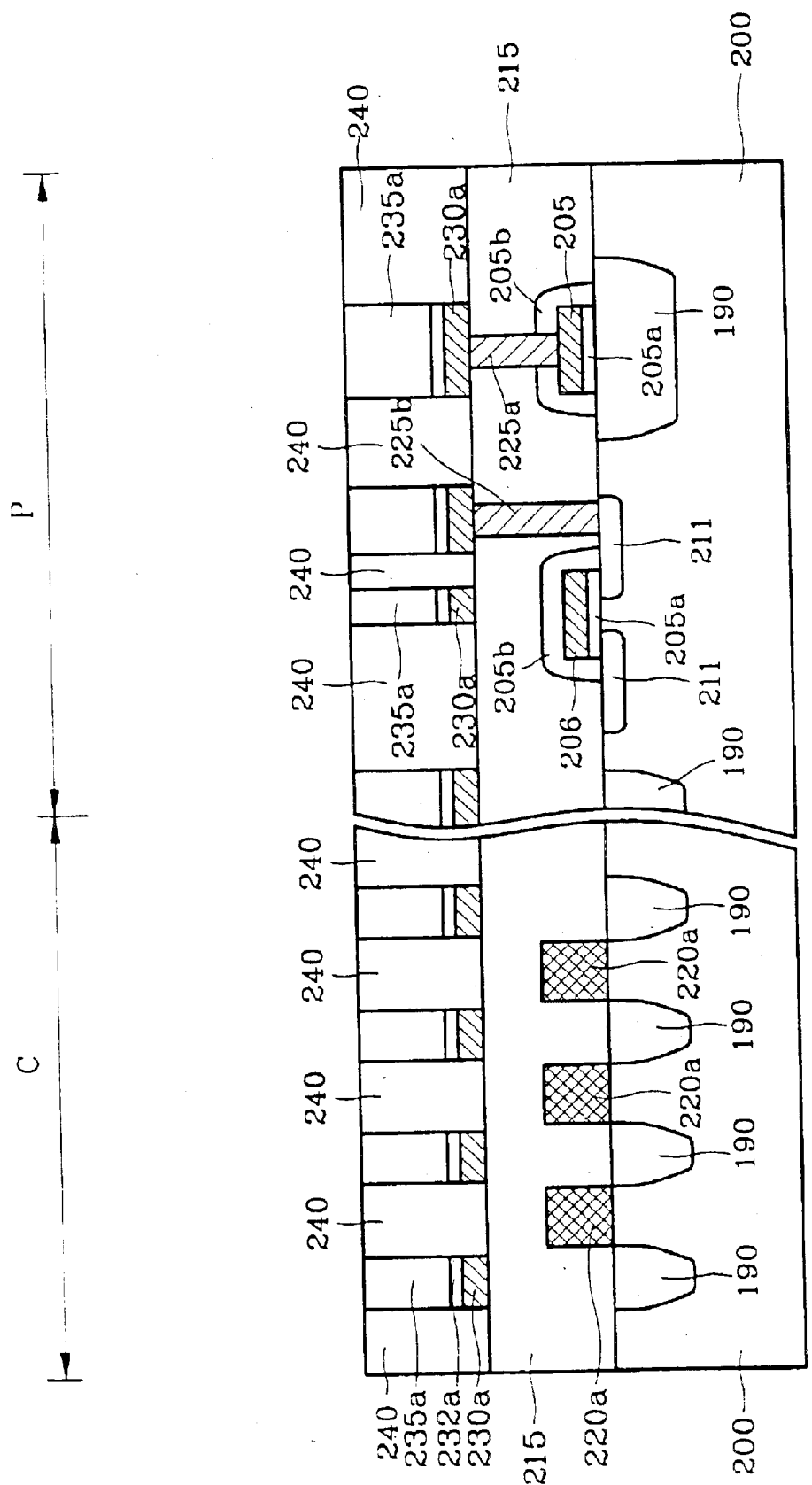

FIG. 13 shows a structure where a dielectric layer 240 is formed having little or no step difference with respect to the conductive patterns 230a, the oxide film patterns 232a and the nitride patterns 235a. A dielectric layer is formed, filling gaps between the conductive patterns 230a, the oxide film patterns 232a and the nitride patterns 235a Next, a CMP process may be performed to expose the upper surfaces of the nitride patterns 235a.

Figure 14:
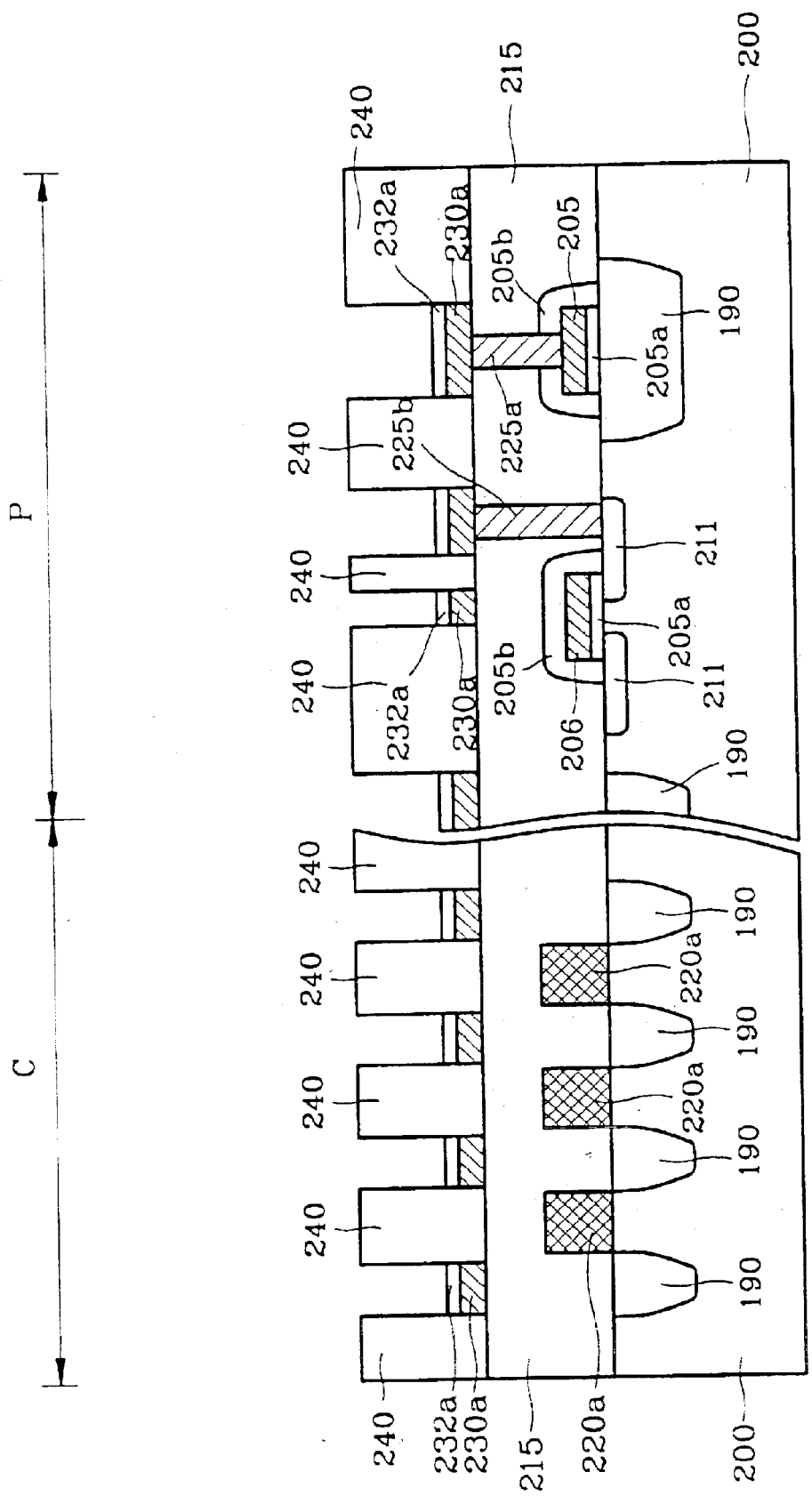

Referring to FIG. 14, the nitride patterns 235a are etched from the resultant structure shown in FIG. 13 to expose oxide film patterns 232a. Because the dielectric layer 240 is not etched, the nitride patterns 235a are preferably etched through an etching process in which they have superior etching selectivity with respect to the dielectric layer 240. The oxide film patterns 232a are etched together with a portion of the dielectric layer 240 in a subsequent process, which can prevent etching of the conductive patterns 230a.

Figure 15:
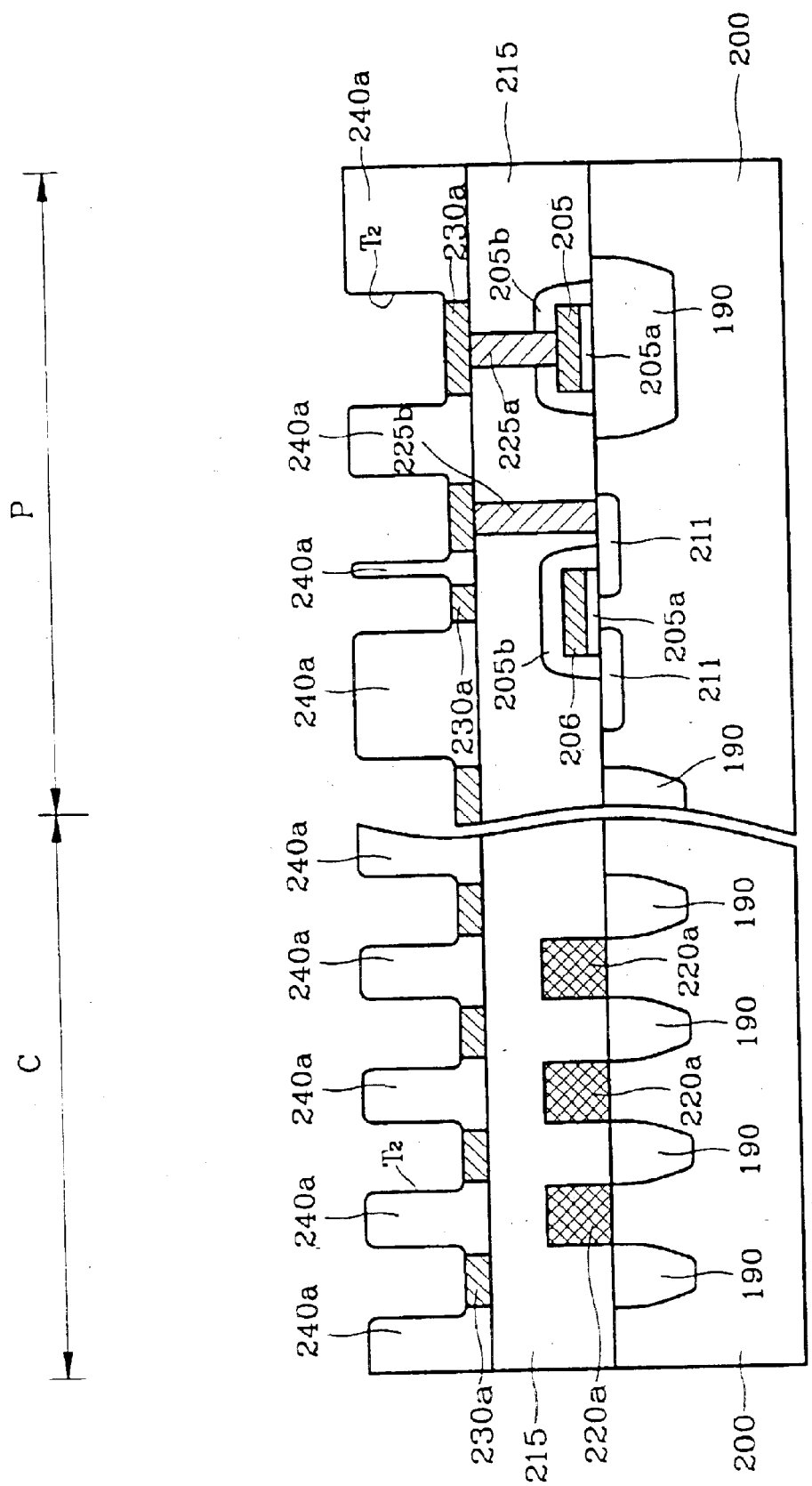

Referring to FIG. 15, a portion of the dielectric layer 240 and the oxide film patterns 232a are wet-etched from the structure shown in FIG. 14. As a result, dielectric patterns 240a are formed between the conductive patterns 230a. The dielectric patterns 240a and the conductive patterns 230a define trenches T2 with widths that are larger than the conductive patterns 230a. It is preferable that a portion of the dielectric layer 240 and the oxide film patterns 232a are etched through an etching process in which the oxide film patterns 232a have little or no etching selectivity with respect to the dielectric layer 240.

Figure 16:
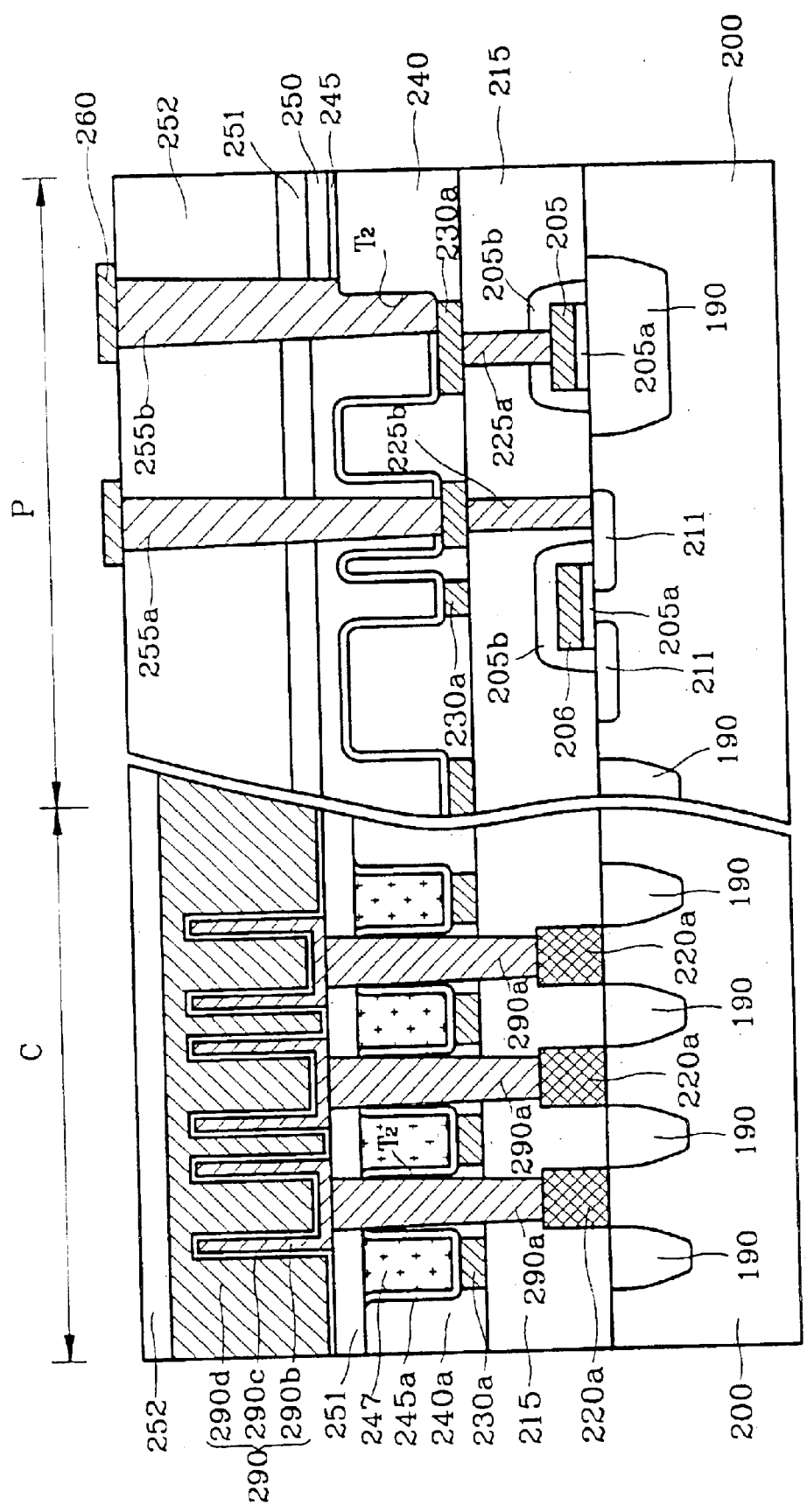

Processes for forming the structure of FIG. 16 are similar to those described for the first embodiments with reference to FIGS. 5–10. In particular, a nitride film liner 245, nitride film studs 247 (including nitride film liner patterns 245a), dielectric layers 250, 251, metal contact plugs 255a, 255b, capacitors 290 (including electrodes 290b, 290d and dielectric 290c), intermetal dielectric layer 252, and metal wiring 260 may be formed as described for corresponding structures in FIGS. 5–10.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
   conductive patterns formed on a semiconductor substrate;
   dielectric patterns disposed between the conductive patterns on the substrate, each having a cross-section with an upside-down T shape, the dielectric patterns and the conductive patterns defining respective trenches on respective ones of the conductive patterns, the trenches having a greater width than the conductive patterns;
   a nitride film liner lining the trenches defined by the conductive patterns and the dielectric patterns;
   a dielectric layer on the nitride film liner, filling the trenches; and
   at least one metal contact plug passing through the dielectric layer and the nitride film liner and in contact with at least one of the conductive patterns.

2. The integrated circuit of claim 1, further comprising:
   first and second gates and first and second sources/drains;
   a lower dielectric layer formed on the first and second gates and the first and second sources/drains; and
   first and second contact plugs each in contact with the first gate and the second source/drain, respectively,
   wherein the conductive patterns contact the upper surfaces of the first and second contact plugs.

3. The integrated circuit of claim 1, wherein the conductive patterns are bit-line stud pads.

4. The integrated circuit of claim 1, wherein the conductive patterns are disposed in a peripheral circuit domain of the semiconductor substrate.

5. The integrated circuit of claim 1, wherein the thickness of the nitride film liner is from 100 Å to 1000 Å.

6. The integrated circuit of claim 1, further comprising a metal interconnection in contact with the upper surface of the metal contact plug.

7. An integrated circuit comprising:
   conductive patterns formed on a semiconductor substrate in first and second domains;
   dielectric patterns disposed between the conductive patterns on the semiconductor substrate, each having a cross-section with an upside-down T shape, the dielectric patterns and the conductive patterns defining respective trenches on respective ones of the conductive patterns, the trenches having a greater width than the conductive patterns;
   a nitride film liner lining the trenches defined by the conductive patterns and the dielectric patterns;
   a dielectric layer in the second domain and filling the trenches;
   nitride film studs having insubstantial step difference with respect to the dielectric patterns on the first domain, the nitride film studs covering the upper surfaces of the conductive patterns;
   at least one capacitor in contact with a conductive region of the semiconductor substrate and passing through the dielectric patterns;
   an intermetal dielectric layer on the capacitor and the dielectric layer; and
   at least one metal contact plug in contact with at least one of the conductive patterns and passing through the intermetal dielectric layer, the dielectric layer and the nitride film liner.

8. The integrated circuit of claim 7, wherein the first domain is a cell domain and the second domain is a peripheral circuit domain.

9. The integrated circuit of claim 7, further comprising:
   first and second gates and first and second sources/drains each formed in the second domain;
   a plurality of third gates and a plurality of third sources/drains in the first domain;
   a lower dielectric layer formed on the first, second and third gates and the first, second and third sources/drains;
   first and second conductive pads formed within the lower dielectric layer and contacting a plurality of third source/drains; and
   first, second and third contact plugs passing through the lower dielectric layer and in contact with upper surfaces of the first gate,
   wherein the conductive pads contact the upper surfaces of the first, second and third contact plugs, and the conductive region includes the upper surface of the first conductive pad.

10. The integrated circuit of claim 7, wherein the conductive patterns are bit line stud pads.

11. The integrated circuit of claim 7, wherein the thickness of the nitride film liner is from 100 Å to 1000 Å.

12. The integrated circuit of claim 7, further comprising a second dielectric layer formed on the nitride film studs, the dielectric patterns and the first dielectric layer, wherein at least one capacitor is formed to pass through the second dielectric layer, and wherein at least one metal contact plug passes through the second dielectric layer.

13. The integrated circuit of claim 7, further comprising a metal interconnection in contact with the upper surface of the metal contact plug.

* * * * *